United States Patent [19]

Kunkel

[11] Patent Number: 5,482,109
[45] Date of Patent: Jan. 9, 1996

[54] MODULAR HEAT EXCHANGER

[75] Inventor: Scott H. Kunkel, Centreville, Va.

[73] Assignee: E-Systems, Inc., Dallas, Tex.

[21] Appl. No.: 212,781

[22] Filed: Mar. 15, 1994

[51] Int. Cl.[6] ................................. F28F 7/00; H05K 7/20
[52] U.S. Cl. .................... 165/80.3; 165/185; 174/16.3; 361/697; 361/707; 361/720
[58] Field of Search .................. 165/80.1–80.5, 165/185; 174/15.1, 16.1, 16.3; 257/712, 714; 361/694–697, 699, 701, 707, 709–711, 720, 721

[56] References Cited

U.S. PATENT DOCUMENTS

| | | |
|---|---|---|
| 3,086,283 | 4/1963 | Webber et al. . |
| 3,163,207 | 12/1964 | Schultz . |
| 3,215,194 | 11/1965 | Sununu et al. . |
| 3,217,793 | 11/1965 | Coe . |
| 3,312,277 | 4/1967 | Shitouras et al. . |
| 3,550,681 | 12/1970 | Stier et al. ................. 165/185 X |
| 3,648,113 | 3/1972 | Rathjen et al. .............. 361/707 |
| 3,992,653 | 11/1976 | Richardson et al. .......... 361/707 |
| 4,322,776 | 3/1982 | Job et al. ..................... 165/185 X |
| 4,337,499 | 6/1982 | Cronin et al. ................ 361/701 X |
| 4,338,652 | 7/1982 | Romanczuk et al. . |
| 4,366,526 | 12/1982 | Lijoi et al. ................... 361/701 X |
| 4,480,287 | 10/1984 | Jensen . |
| 4,701,829 | 10/1987 | Bricaud et al. .............. 165/185 X |
| 4,785,379 | 11/1988 | Goodrich ...................... 361/711 |
| 4,829,402 | 5/1989 | Gewebler et al. ............ 361/692 |
| 4,853,828 | 8/1989 | Penn . |
| 4,933,746 | 6/1990 | King . |
| 5,083,368 | 1/1992 | Frank . |
| 5,184,281 | 2/1993 | Samarov et al. . |

FOREIGN PATENT DOCUMENTS

| | | | |
|---|---|---|---|
| 2607349 | 5/1988 | France ................................ 257/714 |
| 731623 | 4/1980 | U.S.S.R. ............................. 361/699 |
| 1205813 | 9/1970 | United Kingdom . |
| 2052164 | 1/1981 | United Kingdom ............... 174/16.3 |
| 1592072 | 7/1981 | United Kingdom ............... 361/696 |

OTHER PUBLICATIONS

Kerjilian, Q. K. et al., "Heat–Pipe Cooled Stacked Electronic Wafer Package", IBM Tech. Discl. Bull., vol. 18, No. 12, May 1976, pp. 3982–3983.

Tramposch, H., "Optimum Design of Medium–Power Transistor Heat Sinks", IEEE Transactions of Component Parts, Jun. 1963, pp. 94–99.

*Primary Examiner*—Leonard R. Leo
*Attorney, Agent, or Firm*—Rogers & Killeen

[57] ABSTRACT

A heat exchanger and method for mounting and cooling electronic components includes a chassis with plural removable mounting modules and a coolant distributor mounted on the modules. Each of the modules has a thermally conductive core for mounting electronic components and heat transfer ducts integral therewith that form uninterrupted thermal paths for conduction of heat from the electronic components to the coolant in the ducts. Each module has it own coolant ducts so that the weight of the heat exchanger may be reduced by the weight of the ducts when a module is removed, and so that cooling for each module may be separately tailored.

21 Claims, 3 Drawing Sheets

MODULAR HEAT EXCHANGER

BACKGROUND OF THE INVENTION

The present invention relates to an apparatus and method of mounting and cooling electronic components, and more particularly to a modular heat exchanger and method in which removable modules carrying electronic components include a mounting plate and integral heat transfer ducts that conduct heat in uninterrupted thermal paths from the electronic components to the coolant in the ducts.

With reference to FIG. 1, a conventional heat exchanger 10 (shown in overhead plan view) may include a chassis 12 for plural mounting plates 14 carrying one or more electronic components 16. The mounting plates 14 may be placed in a thermally conductive relationship with the chassis 12 so that heat can be transferred from the mounting plates to a stream of coolant in contact with the chassis 12. Coolant passageways 18 convey the coolant past each of the plates 14 so that all of the plates may be cooled. The passageways 18 may have cooling fins (not shown) to facilitate heat transfer.

Various techniques are known for placing the mounting plates 14 in a thermally conductive relationship with the chassis 12. For example, a wedge clamp 22 may be placed in a recess 24 in the chassis next to an edge of a mounting plate and thereafter expanded so that the edge of the plate is pressed into contact with the chassis. In this and other mounting methods, however, the thermal path from the mounting plate to the coolant is interrupted. That is, the mounting plate 14 and the chassis 12 are separated by an interface 26. Microscopic air pockets may be trapped in the interface 26, reducing the efficiency of the heat transfer between the mounting plates and the chassis.

The efficiency of heat transfer in conventional heat exchangers may also be reduced by the alignment of the coolant passageways 18. When the passageways 18 are aligned generally perpendicular to the plates, such as depicted in FIG. 1, the coolant passes each of the plates. The temperature of the coolant flowing through the passageways 18 will gradually increase because the coolant sequentially draws heat from each of the plates 14, with the temperature difference between the interior of the passageway adjacent the last plate downstream and the coolant being smaller than the corresponding difference at the first plate upstream. As a result, less heat will be transferred from the last plates than from the first plates.

Conventional heat exchangers also may be heavier and waste more energy than in the present invention. For example, even though all of the slots for mounting plates in a chassis need not be filled, conventional heat exchangers are designed so that they are capable of handling the combined heat transfer requirements of the maximum number of plates which can be installed in the chassis. The number and size of the coolant passageways 18 and the number of fins 34 in the passageways are selected based on the maximum heat transfer capacity anticipated. When the electronic components generate less heat than capacity, the heat exchanger will be heavier than necessary by the weight of the unneeded passageways and fins. The additional weight is highly undesirable in an assembly that is to be used in airborne and other weight critical applications. Further, the heat exchanger will be consuming more energy than needed as the amount of coolant being pumped through the passageways will exceed the cooling needs of the exchanger, wasting energy used to pump the coolant and wasting coolant if it is vented overboard.

The present invention solves the above noted problems of the prior art heat exchangers. Each of the mounting plates of the present invention include their own integral heat transfer ducts (ducts being passageways of any cross-sectional shape and axial alignment with closed sides and open ends to contain and direct a fluid moving therethrough) so that the thermal paths from the plate to the interior surfaces of the ducts are uninterrupted, so that no unneeded ducting is carried when the heat exchanger is not operating at capacity, and so that the cooling capacity of the modules and heat exchanger may be tailored to match the specific heat transfer requirements of the electronic components on the mounting plate. Further, since each of the ducts conducts heat away from only a single mounting plate, coolant passes only one mounting plate before being exhausted.

Accordingly, it is an object of the present invention to provide a novel method and apparatus for mounting and cooling electronic components that obviates the problems of the prior art and includes removable modules with integral mounting plates and cooling ducts.

It is a further object of the present invention to provide a novel modular heat exchanger and method for mounting and cooling electronic components that improves heat exchanger efficiency by providing an uninterrupted thermal path from the electronic components to the coolant in the cooling duct.

It is yet a further object of the present invention to provide a novel modular heat exchanger and method for mounting and cooling electronic components that improves heat exchanger efficiency and reduces weight by providing each mounting plate with its own cooling duct.

It is still a further object of the present invention to provide a novel modular heat exchanger in which coolant in a duct flows past only a single mounting plate.

It is another object of the present invention to provide a novel modular heat exchanger and method for mounting and cooling electronic components in which heat exchanger capacity can be tailored to match the specific heat transfer requirements of the electronic components on the mounting plate.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
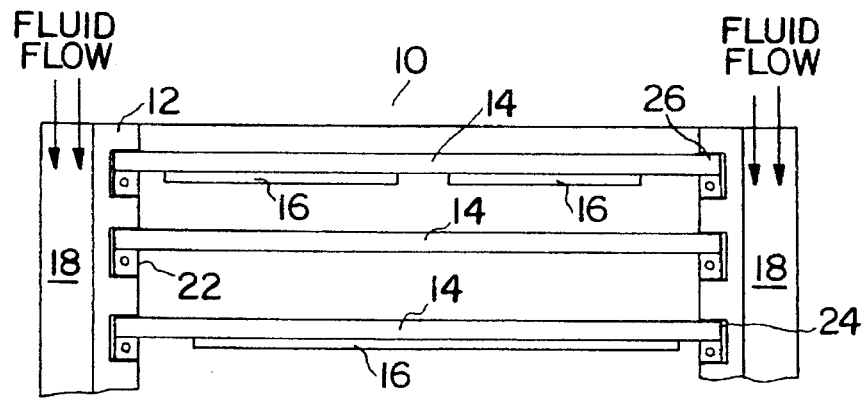
FIG. 1 is an overhead plan view of a prior art heat exchanger.
Figure 2:
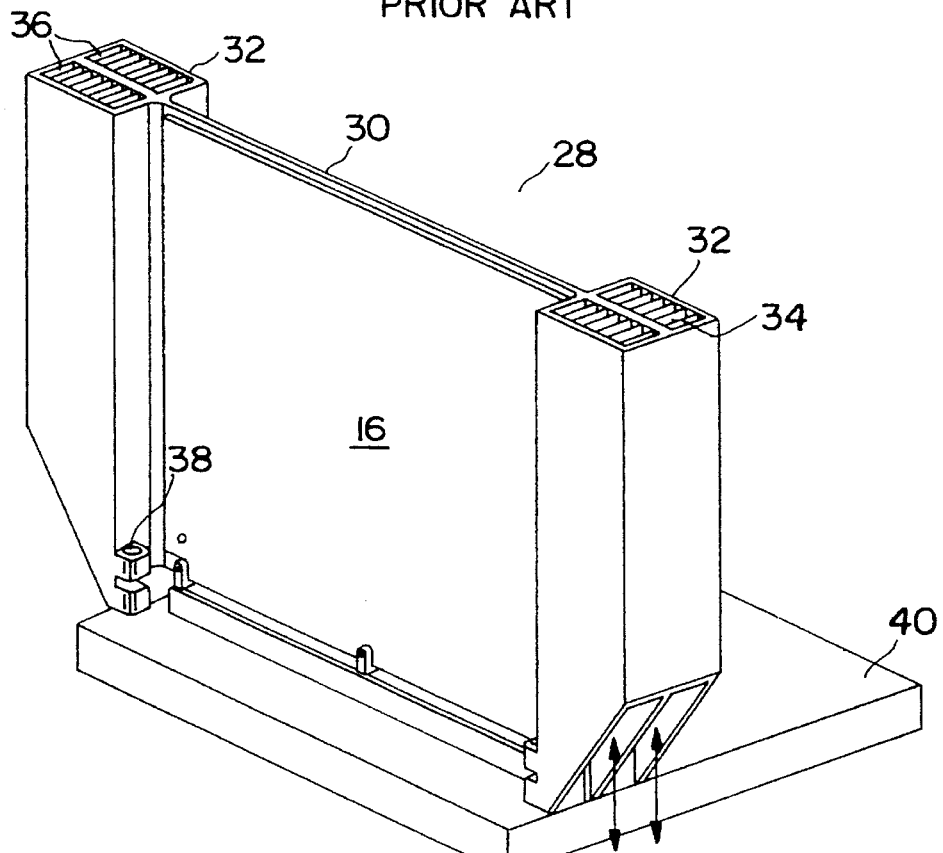
FIG. 2 is a pictorial representation of an embodiment of a heat exchanger of the present invention.
Figure 3:
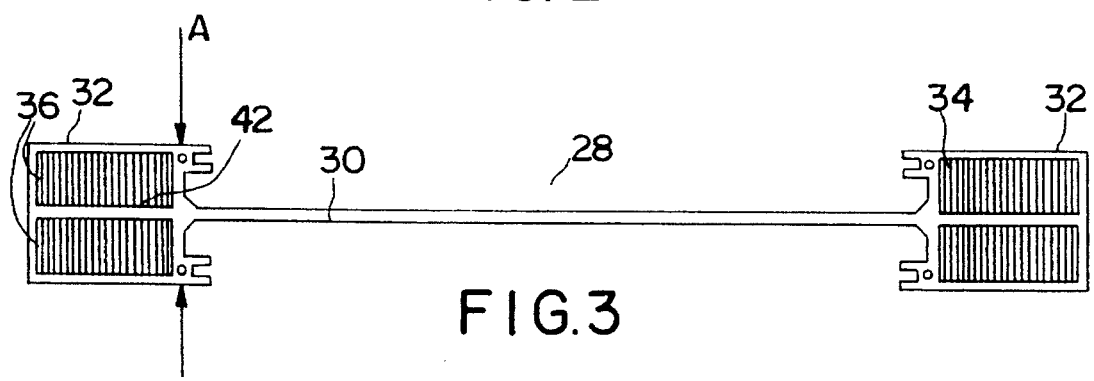
FIG. 3 is an overhead plan view of an embodiment of a module of the present invention.

With reference now to FIGS. 2 and 3, an embodiment of the present invention may include a module 28 with a mounting plate 30 for carrying electronic components 16 and heat transfer ducts 32 for conveying a coolant along the edges of the plate 30. Heat from the electronic components may be conducted through the plate 30 to its edges and to the interior surfaces of the ducts for transfer to the coolant in the ducts 32. The ducts 32 may have fins 34 therein oriented fin the direction of coolant flow to facilitate heat transfer no the coolant, and may include one or more conduits 36 for increasing the interior surface area (the cooling surface area) of the ducts 32. The number and size of conduits 36 and arrangement and number and type of fins 34 may be selected based on the heat transfer requirements of the electronic components 16 mounted on the plate 30. Fasteners 38 may be provided to attach one or more of the modules 28 to a chassis 40.

As may be more clearly seen in FIG. 3, the plate 30 and ducts 32 may be integrally formed so that there are not any interfaces between the plate 30 and interior surface of ducts 32 where heat is transferred to the coolant. To this end, the plate 30 and ducts 32 may be a single piece of thermally conductive material, or several sections of thermally conductive material integrally joined. The continuity of the thermally conductive material provides an uninterrupted thermal path for the conduction of heat from the plate 30 to the interior surfaces of the ducts 32. In a preferred embodiment, the duct 32 has two conduits 36, with the conduits being divided by an extension 42 of the plate 30. The ducts 32 may have openings at both ends so that they can be connected to a coolant distribution and exhaust system, such as discussed below.

The fins 34 may be individual thermally conductive metal slats (see, for example, FIG. 2) that may be bonded, vacuum brazed, or otherwise affixed to the interior surfaces of the ducts in a thermally conductive relationship. The fins may be affixed to the extension 42 and to a side of the duct so that heat may be transferred through both ends of the fins. The fins 34 may also be integral with the duct and plate (see, for example, FIG. 6), or may be a metal sheet sinuously folded and affixed to the duct at the folds and at the ends of the sheet (see, for example, FIG. 4).

Figure 4:
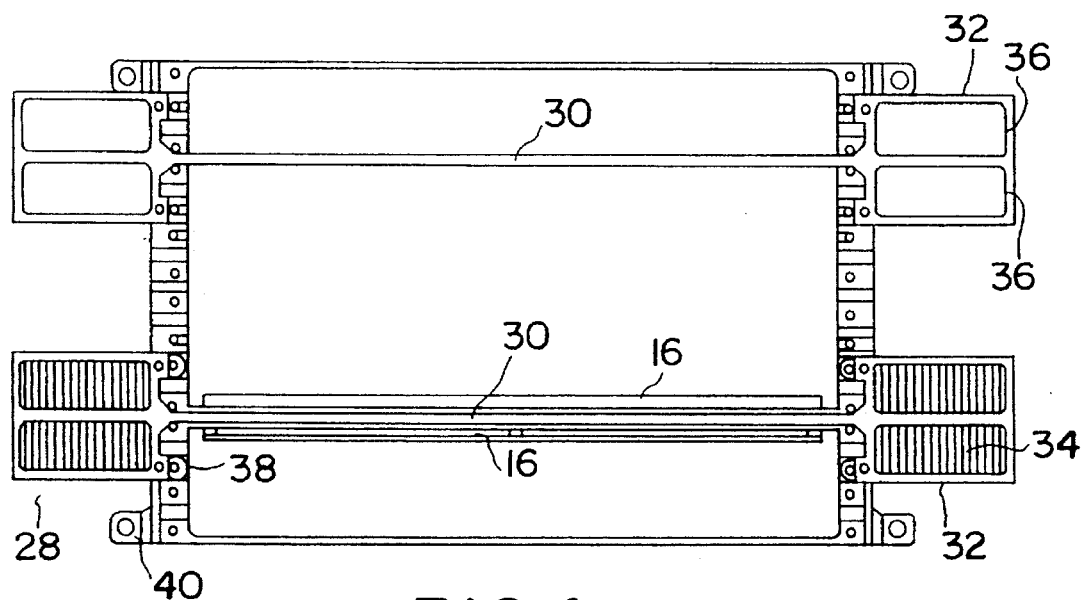
FIG. 4 is an overhead plan view of modules of the present invention carried in a chassis.
Figure 5:
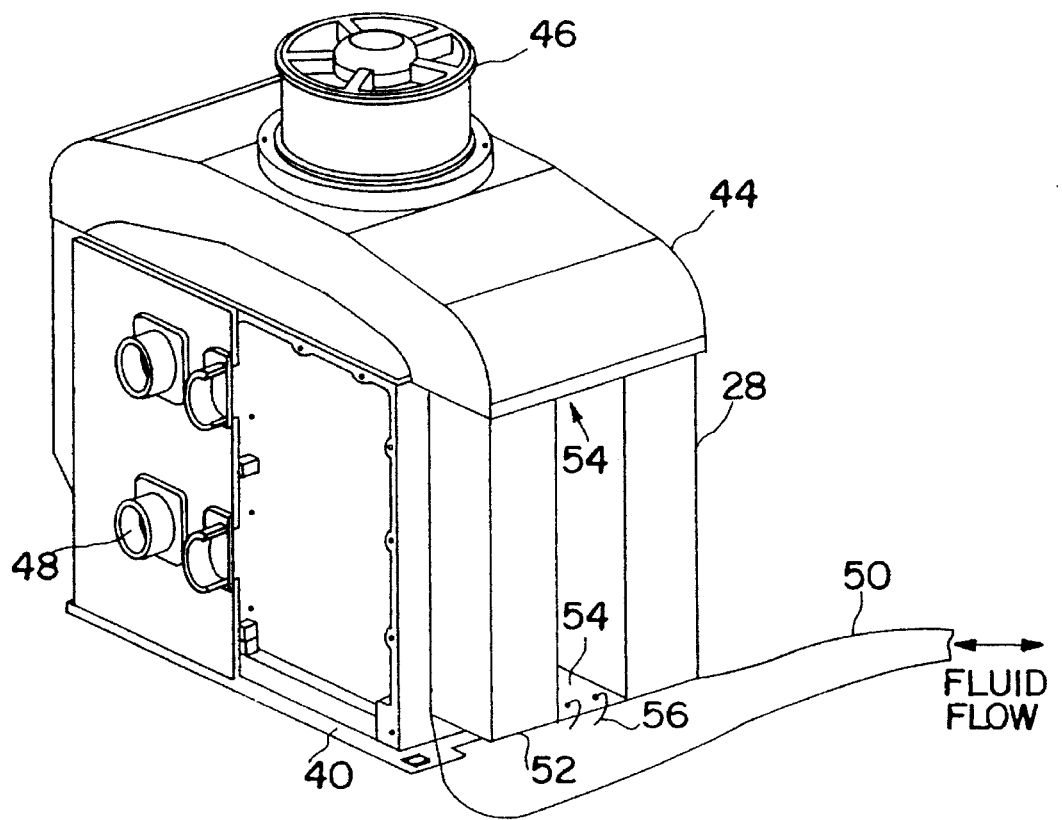
FIG. 5 is a pictorial representation of an embodiment of the heat exchanger of the present invention illustrating a coolant distribution/exhaust cover.
Figure 6:
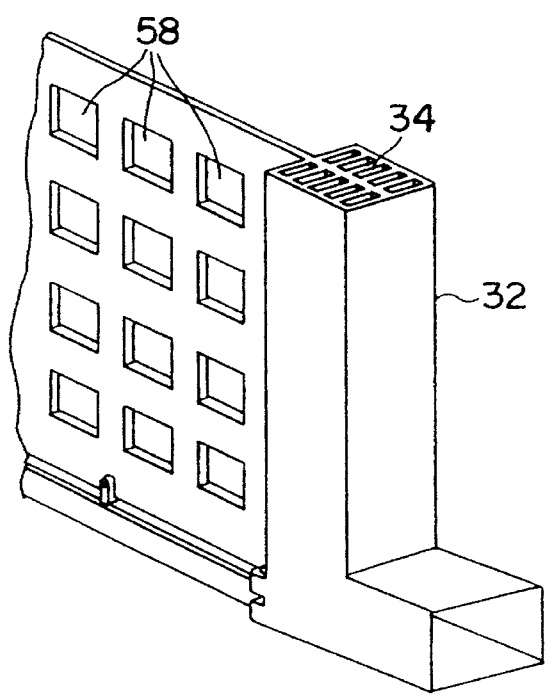
FIG. 6 is a pictorial representation of a further embodiment of a module of the present invention.

With reference now to FIGS. 4 and 5, the modules 28 may be carried by the chassis 40 so that the openings at the top and bottom of the ducts 32 may be reached by an intake and exhaust of a coolant distribution system. For example, the modules 28 may have ducts 32 with top and bottom openings that are beyond the edge of the chassis 40, such as illustrated in FIG. 4, or the modules may be no wider than the chassis and the chassis may have openings corresponding to the duct openings at the bottom of the ducts, or the modules may be no wider than the chassis and the ducts may have top and bottom openings at the side (e.g., with an elbow bend such as depicted in FIG. 6). As may be seen in FIG. 4, the chassis 40 may have a mounting surface with receptacles for a plurality of modules 28 and their fasteners 38.

In a preferred embodiment, and with reference to FIG. 5, the modules 28 may be covered with a coolant distribution/exhaust cover 44 that may include a fan 46 or other pumping apparatus to replenish or exhaust the coolant. The cover 44 may enclose the top of the modules 28, including the openings at the top of the ducts, and may have access ports 48 for providing electrical connections to the electrical components. In the event the coolant is air, the pump 46 may draw air through the ducts 32 that are open to the atmosphere at the bottom opening. In the event the coolant is not air, a coolant distribution system may be used. For example, a distribution system may include a pipe 50 with an outlet 52 for each duct 32. If the number of modules 28 does not fill each receptacle in the chassis 40 (e.g., as illustrated in FIGS. 4 and 5) blank-off plates 54 may be added to the cover 44 and pipe 50 to close the unused openings. The blank-off plates 54 may open and close automatically when the module 28 is inserted, and to this end, the blank-off plates 54 may be operated with springs 56 and the ducts may be provided with arms to push open the plates 54.

In the embodiment of the invention shown in FIG. 5, it is also apparent that in any particular cycle in which coolant is passed through the heat exchanger, the same coolant does not pass through any two of the provided ducts.

The chassis 40 and cover 44 may be provided in standard sizes, with each standard size accommodating a different number of modules 28. This feature of the present invention is especially advantageous for air-cooled airborne systems in which weight is an important factor. By using the modules 28, each with their own ducts, and by selecting the smallest suitable cover and chassis, the weight of the heat exchanger may be reduced. The weight may be further reduced by selection of a lightweight, thermally conductive material for the mounting plate and ducts or by removing unused portions 58 of the mounting plate such as illustrated in FIG. 6 or by reducing mounting plate thickness.

The coolant may be any conventional fluid that may be used to convey heat away from the interior surfaces of the ducts 32. For example, the coolant may be a gas, such as air that is drawn through the ducts 32 by the fan 46, or a liquid that may be transported to the ducts with a piping system. The specific coolant may be selected to meet the cooling requirements of the electronic components, and since the coolant is in the ducts and separated from the components, the type of coolant that may be used is not restricted by the effect of the coolant on the components.

Figure 7:
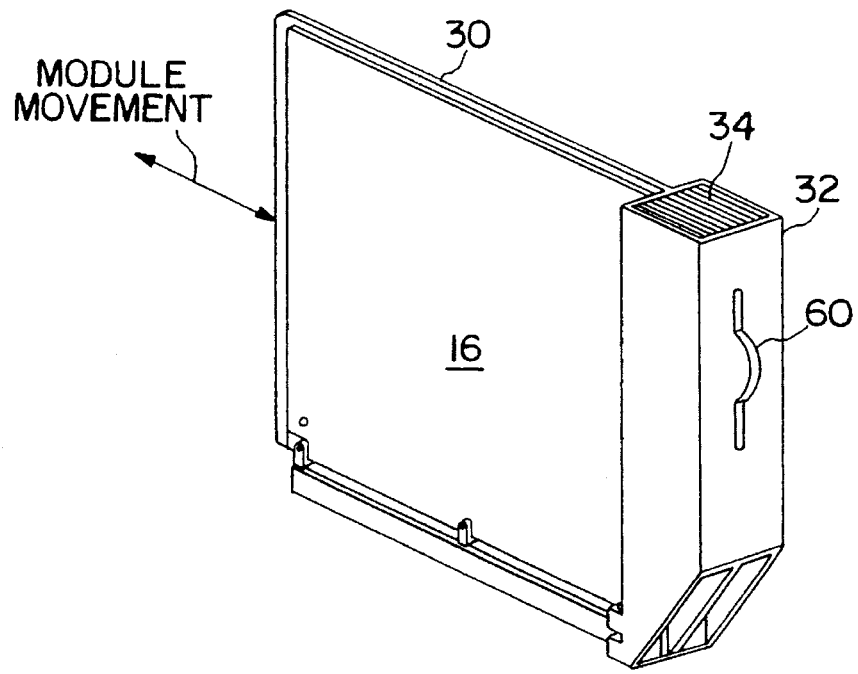
FIG. 7 is a pictorial representation of a further embodiment of a module of the present invention.

In alternative embodiments, the fins 34 in the ducts 32 may be aligned parallel to the plate in a single conduit, such as illustrated in FIG. 7. As seen therein, the module may be provided with a single duct 32 to further reduce weight, if heat transfer requirements permit. This embodiment may be particularly suited to applications in which the module may slide into a chassis in the directions shown by the arrow in FIG. 7, and a handle 60 may be provided to facilitate this movement.

The width of the module 28 (dimension A in FIG. 3) may also be varied to accommodate particular cooling requirements or diversely sized electronic components. For example, the width of some modules may be one-half (or twice) a standard width so that two modules can fit in one receptacle in the chassis 40 in the event cooling requirements are small (or one module in two receptacles in the event the module carries an oversized electronic component).

Figure 8:
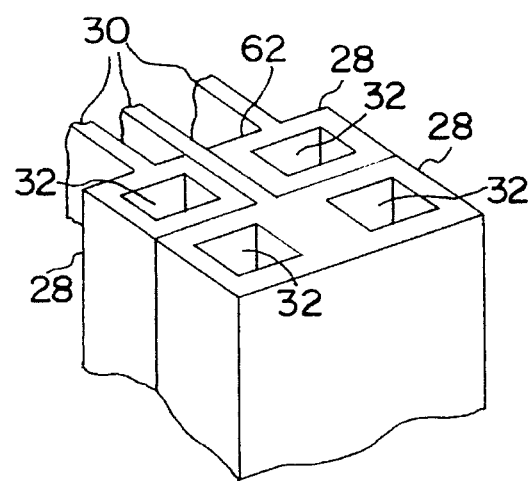
FIG. 8 is a pictorial representation of nested modules of differing lengths.

As depicted in FIG. 8, the modules 28 may have different lengths so that the modules can be nested and the plates arrayed more closely without significant degradation of heat transfer efficiency (although the thermal path is slightly longer and thermal transfer between modules may be higher).

In other embodiments the modularity of the present invention may provide additional flexibility in selection of various heat transfer capacities. As indicated by the separation 62 between the plate 30 and duct 32 in FIG. 8, a duct 32 may be selectively detachable from the plate 30 and replaced with a duct having a different heat transfer capacity (for example, with more fins or conduits). The duct may be attached with conventional fasteners or the plate and duct may have a tongue and groove, or the like.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A modular heat exchanger comprising:

a chassis having a mounting surface;

plural modules, each of said modules being removably attachable to said mounting surface and comprising, a thermally conductive plate for carrying electronic components, and a heat transfer duct attached to each of two opposing edges of said plate for conveying a coolant along an edge of said plate, each said duct being connected so that coolant does not pass through more than one said duct, said plate and each said heat transfer duct forming an uninterrupted thermal path for conducting heat from the electronic components to the coolant; and plural fins in said duct for facilitating conduction of heat from said duct to the coolant, said fins being in thermal communication with said duct.

2. The heat exchanger of claim 1 wherein each said duct comprises two coolant conduits separated by an extension of said plate through said duct.

3. The heat exchanger of claim 2 wherein said fins are affixed to said extension.

4. The heat exchanger of claim 1 wherein said duct has an inlet for the coolant that does not overlie said chassis.

5. The heat exchanger of claim 1 further comprising a coolant supply pipe with an outlet for each said duct.

6. The heat exchanger of claim 5 further comprising openable blank-off plates over each said pipe outlet that are opened by said modules and that stop the coolant from flowing therethrough when closed.

7. The heat exchanger of claim 1 further comprising a coolant distribution cover on said plural modules overlying each said duct for effecting movement of the coolant through each said duct.

8. The heat exchanger of claim 7 wherein said cover comprises a pump for the coolant.

9. The heat exchanger of claim 7 wherein said cover comprises openable blank,off plates that are opened by said modules and that stop the coolant from flowing therethrough when closed.

10. A module for carrying electronic components and for conducting heat therefrom, said module being carried on a chassis for a heat exchanger that includes a system for conveying a coolant to said module to conduct heat therefrom, said module comprising:

a thermally conductive plate for carrying the electronic components, said plate having two opposing edges;

a heat transfer duct at each of said edges, each said heat transfer duct having openings for conveying a heat transfer fluid therethrough along one of said edges to conduct heat from said plate, said plate and said heat transfer duct being integrally formed to thereby create an uninterrupted thermal path for conducting heat away from electronic components carried by said plate to interior surfaces of each said heat transfer duct, wherein at least one said duct comprises two coolant conduits separated by an extension of said plate through said duct.

11. The module of claim 10 further comprising plural fins affixed to said extension for facilitating conduction of heat from said duct to the coolant.

12. A heat exchanger for electronic components comprising a coolant distributor, a coolant distributor cover and plural modules removably mounted on a chassis, each of said modules having its own coolant ducts attached to opposing edges thereof that are in communication with said coolant distributor cover that overlies said plural modules such that the coolant passing through any one duct does not pass through any of the other ducts.

13. The heat exchanger of claim 12 further comprising means for tailoring the cooling capability of said coolant ducts to the heat that is to be conducted from the electronic components.

14. The heat exchanger of claim 12 wherein said chassis comprises receptacles for holding said modules, and wherein said modules have widths so that the number of modules per receptacle may be selectively varied.

15. The heat exchanger of claim 14 wherein the widths of selected ones of said modules is twice the receptacle size so that one of said modules may be held in two of said receptacles.

16. A method of mounting and cooling electronic components carried on modules comprising the steps of:

providing each of the modules with a thermally conductive core for mounting the electronic components;

providing a thermal transfer duct at an edge of the core, the duct and the core forming a thermal path from the electronic components to an interior surface of the duct;

providing the duct with two coolant conduits separated by an extension of the core through the duct;

providing plural fins in the duct for facilitating conduction of heat to a coolant in the duct;

removably attaching the modules to a chassis having a mounting surface; and conveying the coolant through the duct to thereby cool the electronic components.

17. The method of claim 16 further comprising the step of affixing the fins to the extension of the core.

18. The method of claim 16 further comprising the step of providing each module with two ducts, one on each of two opposing edges of the core.

19. The method of claim 16 further comprising the step of attaching a coolant supply pipe with an openable outlet for each duct.

20. The method of claim 19 further comprising the step of opening the outlet when the module is attached to the chassis.

21. The method of claim 16 further comprising the step of attaching a coolant distribution cover on the modules overlying each the duct for effecting movement of the coolant through the duct.

\* \* \* \* \*